US009756751B1

(12) United States Patent
Bowker

(10) Patent No.: US 9,756,751 B1
(45) Date of Patent: Sep. 5, 2017

(54) TUNABLE VIBRATION ISOLATION SYSTEM WITH INTEGRATED A-FRAME ARCHITECTURE FOR LOW PHASE NOISE RADIO FREQUENCY SYNTHESIZERS

(71) Applicant: Lockheed Martin Corporation, Bethesda, MD (US)

(72) Inventor: Bryan James Bowker, Marlton, NJ (US)

(73) Assignee: LOCKHEED MARTIN CORPORATION, Bethesda, MD (US)

( * ) Notice: Subject to any disclaimer, the term of this patent is extended or adjusted under 35 U.S.C. 154(b) by 1 day.

(21) Appl. No.: 15/059,141

(22) Filed: Mar. 2, 2016

Related U.S. Application Data

(60) Provisional application No. 62/129,020, filed on Mar. 5, 2015.

(51) Int. Cl.
*H05K 9/00* (2006.01)
*H05K 7/14* (2006.01)
*H05K 7/20* (2006.01)

(52) U.S. Cl.
CPC ............. *H05K 7/14* (2013.01); *H05K 7/2039* (2013.01); *H05K 9/002* (2013.01)

(58) Field of Classification Search
CPC ......... H05K 7/14; H05K 7/2039; H05K 9/002
USPC .................................. 361/816, 818; 174/387
See application file for complete search history.

(56) References Cited

U.S. PATENT DOCUMENTS

| 4,152,671 A * | 5/1979 | Tuma ....................... H05K 7/14 174/366 |
| 4,490,813 A * | 12/1984 | Gasparaitis ............... H03J 1/04 365/230.01 |
| 4,642,735 A * | 2/1987 | Hodsdon ................. H05K 9/002 174/387 |
| 4,851,798 A * | 7/1989 | Hietala .................... H03J 3/185 334/66 |
| 5,485,672 A * | 1/1996 | Carpenter ............ H05K 7/1417 174/254 |
| 5,686,697 A | 11/1997 | Miller et al. |
| 6,613,979 B1 | 9/2003 | Miller et al. |
| 7,856,878 B2 | 12/2010 | Hotelling et al. |
| 2012/0188037 A1* | 7/2012 | Fullerton .................. F16F 6/00 335/296 |

(Continued)

*Primary Examiner* — Sherman Ng
(74) *Attorney, Agent, or Firm* — Howard IP Law Group, PC

(57) ABSTRACT

A radio frequency (RF) frequency synthesizer includes a chassis housing that holds components of the RF frequency synthesizer. The chassis housing is installable into an instrument cabinet. A pair of mounting brackets are connected to opposing interior sides of the chassis housing and receive an A-Frame assembly which supports vibration sensitive RF circuitry and RF components. The A-Frame assembly is attached to the pair of mounting brackets in the chassis housing and provide a spatial separation between the kinematic inputs and the vibration sensitive RF circuitry and RF components. The A-Frame assembly includes a folded sheet, the folded sheet defining an angle between a first planar region and a second planar region, and may include a planar frame cross-member attached to the first planar region and the second planar region, the planar frame cross-member spanning the angle between the first and second planar regions.

18 Claims, 5 Drawing Sheets

(56) References Cited

U.S. PATENT DOCUMENTS

2014/0091887 A1* 4/2014 Roberts ................ H01F 7/0236
335/219

* cited by examiner

TUNABLE VIBRATION ISOLATION SYSTEM WITH INTEGRATED A-FRAME ARCHITECTURE FOR LOW PHASE NOISE RADIO FREQUENCY SYNTHESIZERS

CROSS REFERENCE TO RELATED APPLICATIONS

This application claims the benefit of priority under 35 U.S.C. §119(e) to U.S. Provisional Patent Application Ser. No. 62/129,020 filed Mar. 5, 2015 entitled TUNABLE VIBRATION ISOLATION SYSTEM WITH INTEGRATED A-FRAME ARCHITECTURE FOR LOW NOISE PHASE RADIO FREQUENCY SYNTHESIZERS, which is incorporated by reference herein in its entirety for all purposes.

FIELD OF THE INVENTION

This application relates to radio frequency (RF) synthesizers. In particular, the application relates to RF frequency synthesizers utilizing RF oscillators.

BACKGROUND OF THE INVENTION

Radio frequency (RF) synthesizers rely on crystal oscillators to generate RF frequencies. The crystals within these oscillators are susceptible to vibration and their performance is a function of kinematic environments. Kinematic environments may include axis of excitation, level or magnitude, spectral signature of a disturbance as well as other factors including g-sensitivity, which is defined as a change in frequency resulting from an acceleration force applied to an oscillator. Satisfying aggressive phase noise and spurious performance for synthesized RF frequencies is difficult; especially when subjected to kinematic environments such as sinusoidal vibration, random vibration and/or shock. Advances in electrical and mechanical techniques as well as additional technology are required in order to mitigate these environmental influences and meet target RF performance requirements.

SUMMARY

A radio frequency (RF) frequency synthesizer includes a chassis housing that holds components of the RF frequency synthesizer. The chassis housing may be configured for installation into an instrument cabinet. One or more mounting brackets are connected to opposing interior sides of the chassis housing and adapted to receive an A-Frame assembly which supports one or more circuit boards. Each circuit board includes circuitry utilizing an RF oscillator. The A-Frame assembly is attached to the one or more mounting brackets in the chassis housing and provides a spatial separation between the kinematic inputs and the sensitive RF oscillators. The A-Frame assembly includes a folded sheet in the form of an A or V configuration, the folded sheet defining an angle between a first planar region and a second planar region, and optionally, a planar frame cross-member attached to the first planar region and the second planar region, wherein the planar frame cross-member spans the angle between the first and second planar regions.

In one embodiment, a radio frequency (RF) synthesizer comprises a chassis housing configured to hold components of the RF synthesizer, the chassis housing being installable into an instrument cabinet; one or more mounting brackets connected to at least one interior side of the chassis housing; an A-frame assembly configured to support at least one component of the RF synthesizer, the at least one component being susceptible to vibrational noise, the A-frame assembly being attached to the mounting brackets and comprising at least two planar regions, wherein at least one of the planar regions supports the at least one component of the RF synthesizer that is sensitive to vibrational noise, and wherein the planar regions include a first planar region and a second planar region which contact each other at a common edge to form an angle between the first planar region and the second planar region.

In one embodiment, an A-frame assembly for supporting vibration sensitive radio frequency (RF) components and configured for installment in an instrument cabinet comprises: a first planar region; and a second planar region, wherein at least one of the first planar region and the second planar region are configured to support at least one of the vibration sensitive RF components, and wherein the first planar region and the second planar region are in contact with one another along a common edge, the common edge defining an angle between the first planar region and the second planar region.

In one embodiment, a method for tuning the spectral response of an assembly configured to support vibration sensitive radio frequency (RF) components, the assembly including a first planar region and a second planar region arranged with respect to one another to define an angle along a common edge of the first planar region and the second planar region, and a third planar region defining a frame cross member attached to the first planar region and the second planar region, the frame cross member spanning the angle defined between the first planar region and the second planar region, the method comprising the steps of: selecting a material for at least one of the first planar region, the second planar region and the third planar region, wherein the spectral response of the assembly is dependent at least in part on the selected material; and selecting a thickness of at least one of the first planar region, the second planar region and the third planar region, wherein the spectral response of the assembly is dependent at least in part on the selected thickness.

DETAILED DESCRIPTION

RF frequency synthesizers utilize sensitive equipment, for example, crystal oscillators, to synthesize RF frequencies or mix with other inputs to form RF frequency outputs. This equipment may be extremely sensitive to kinematic environments, which generate sinusoidal vibration spectral signatures, random vibration spectral signatures and shock spectral signatures, which ultimately reach the equipment. Sinusoidal, random and shock vibrations may affect the precision of the oscillators and thereby affect the output frequency of the crystal oscillators. These effects in turn, affect the spectral purity of the waveform of the RF frequency synthesizer. Crystal oscillators are often connected to circuit boards which are mounted on a chassis of the RF frequency oscillator. For example, one or more circuit boards may be arranged vertically or horizontally and secured to a box-shaped chassis frame. External sources of vibration may interact with the chassis housing and are transferred through the connection or contact points between the chassis and the vibration sensitive RF circuitry and RF components associated with the crystal oscillators. These outside environmental disturbances impact phase noise and spurious emissions from the RF frequency synthesizer which degrade performance.

Figure 1:
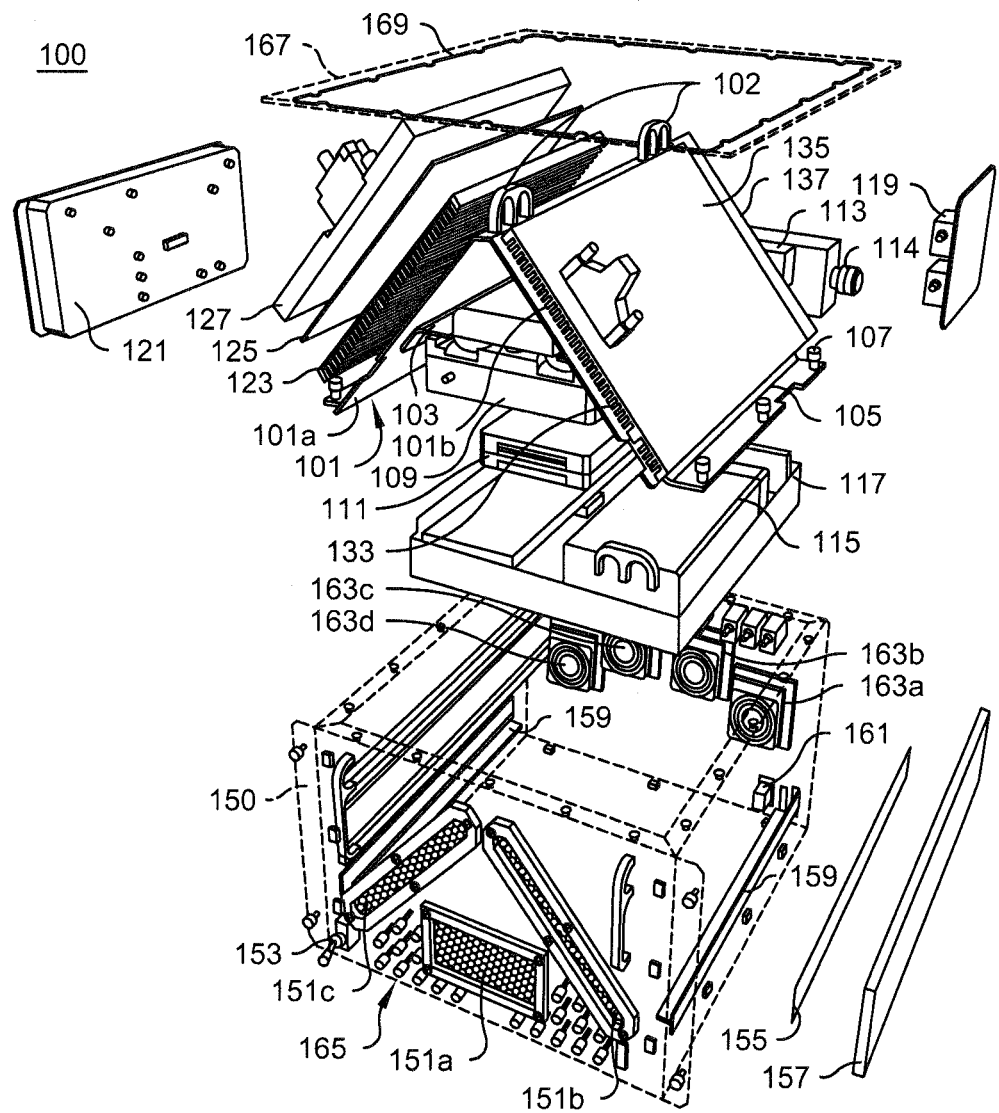
FIG. 1 is an isometric, partially exploded view of a RF frequency synthesizer according to an embodiment of the disclosure.

FIG. 1 is an isometric partially exploded view of an RF frequency synthesizer that includes an A-Frame shaped support assembly for housing vibration sensitive crystal oscillators or other environmentally sensitive equipment. The vibration sensitive RF oscillators are disposed on surfaces of an A-Frame assembly 101. The vibration sensitive RF oscillators may be mounted on the A-Frame assembly 101, 103 by passive isolation mounts (e.g. elastomeric mounts 201, shown in FIG. 2). The A-Frame assembly 101 including the attached sensitive RF oscillators is mounted to a chassis housing 150 of the RF frequency synthesizer. The A-Frame assembly 101 provides a spatial separation of external vibrations or disturbances that impinge on the housing 150 of the synthesizer. The A-Frame assembly 101 is removably attached to the chassis housing 150 and may be simply and easily removed from the chassis housing 150. Once removed, the A-Frame assembly 101 keeps the RF frequency oscillators and other RF components connected and intact, and may be placed on a workbench for connection and testing or troubleshooting. This configuration enhances manufacturability, maintainability and testability of the RF synthesizer components and RF circuits.

Referring to FIG. 1, RF frequency synthesizer 100 includes a box-shaped chassis housing 150. Chassis housing 150 defines a volume which contains the components to implement an RF frequency synthesizer. For example, chassis housing 150 includes mounting brackets 159 for attaching the A-Frame assembly (101,103) via flange 105 and fasteners 107. Chassis housing 150 further accommodates a power supply 115, a processor board assembly 111, a low-frequency 10 MHz assembly 121, clock distribution circuit 119, and input AC power filter 113. Chassis housing 150 includes cover 167 and associated electromagnetic interference (EMI) shielding gasket 169 for enclosing the components of RF frequency synthesizer 100. Clock distribution circuit 119 and 10 MHz assembly 121 are mounted to sides of the chassis housing 150 and not attached to the A-Frame assembly (101, 103) as these components are less susceptible to kinematic disturbances.

An external AC power source (not shown) enters the chassis housing 150 via AC power filter 113, which provides electromagnetic interference (EMI) filtering. The filtered AC power is delivered via connection 114 to a shielded cable which is connected to power supply assembly 115. The power supply assembly 115 provides power throughout the chassis housing 150 to all electronic components within housing 150. Power within the chassis may be controlled via toggle switch 153. The toggle switch 153 is disposed on a forward facing surface of the chassis housing 150. Light emitting diodes 165 may also be mounted on the face of the chassis housing 150 to provide status indications for various functionalities of RF frequency synthesizer 100. The chassis housing 150 includes ventilation fans 163a, 163b, 163c, and 163d which provide airflow through the chassis housing 150 for cooling the RF circuitry and RF components. Air inlets 151a, 151b and 151c are defined in a facing surface of the chassis housing to provide air flow to areas corresponding to locations of RF frequency circuits supported by the A-Frame assembly 101, 103. Air inlets 151a, 151b and 151c may include an EMI shield for preventing interference from entering the chassis housing 150. A communications port 161 may be provided at the exterior face of the chassis housing to provide a data connection for programming or configuring the RF frequency synthesizer 100. In one non-limiting example, communications port 161 may be a Universal Serial Bus (USB) connection.

An A-Frame assembly 101, 103 supports RF sensitive oscillators within the chassis housing 150. The A-Frame assembly 101, 103 includes a first angled sheet 101 which may include a single sheet that is folded at a selected angle to produce two planar regions 101a, 101b sharing a common edge at the fold producing the angle. The two planar regions may be symmetrical, or the first planar region may have dimensions that differ from the second planar region. A frame cross-member 103 is attached to the first and second planar surfaces spanning the fold angle. The frame cross-member 103 defines a third planar region between the first planar region 101a and second planar region 101b of the folded sheet 101 and is supported by the first and second planar regions 101a, 101b. The first folded sheet 101 may be folded to create a single ridge at its apex where the first and second planar regions 101a, 101b meet. In an embodiment, for example the embodiment illustrated in FIG. 1, the folded sheet 101 may be folded to form a bezel between the first planar region 101a and second planar region 101b. The bezel defines a surface which may be used for attachment of handles 102 to provide easy removal of the A-Frame assembly (101, 102, 103) from the chassis housing 150.

Folded sheet 101 defines supporting surfaces at the first and second planar regions 101a, 101b, for RF components such as RF oscillators. The RF circuitry and RF components, such as RF oscillators may be implemented on circuit boards 125, 135. The circuit boards may be mounted on a heat sink 123, 133 which is attached directly to the surface of the first or second planar region 101a, 101b. An EMI shield 127, 137 may be placed over circuit board 125, 135 to shield the RF oscillator and other RF components from EMI. As may be seen in EMI shield 127 of FIG. 1, the underside of EMI shield 127 defines walled recesses which cover portions of the components mounted on circuit board 125 and provide EMI shielding between circuit components.

Frame cross-member 103 includes a third planar region defining upper and lower surfaces which may support additional RF components, referred herein as the master source circuitry 109. Master source circuitry 109 is surrounded by EMI shield 117 for protecting the master source circuitry 109 from interference generated from outside circuitry or environmental disturbances. The master source circuitry 109 may be seen in more detail with reference to FIG. 2. Chassis housing 150 may be mounted inside an equipment cabinet via shims 155 and retractable slides 157.

Figure 2:
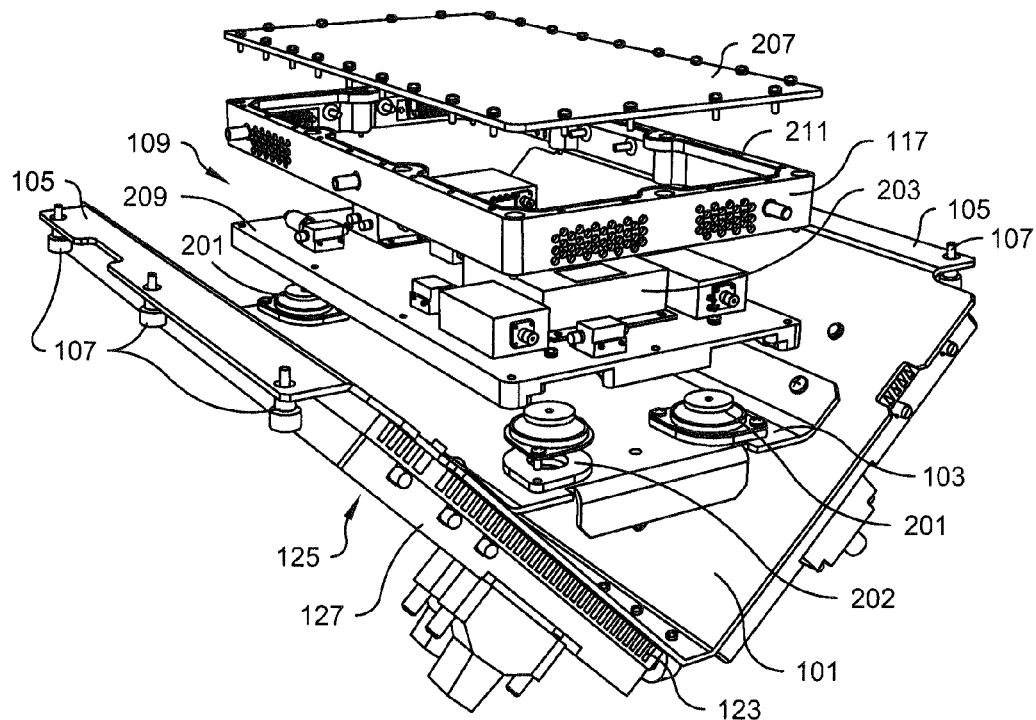
FIG. 2 is an isometric exploded view of an A-Frame assembly for supporting equipment sensitive to kinematic environments in the RF frequency synthesizer of FIG. 1.

FIG. 2 is an exploded view of the A-Frame assembly 101, 103 used in the RF frequency synthesizer of FIG. 1. Folded sheet 101 (shown inverted in FIG. 2) supports circuit board 125 along with its associated heat sink 123 and EMI shield 127. Folded sheet 101 includes flanges 105 at its edges for connecting folded sheet 101 to the chassis housing using fasteners 107. Frame cross-member 103 supports circuitry including vibration sensitive RF oscillators 203 via a base plate 209. The master source circuitry 109 is surrounded by EMI shield 117, which includes an EMI preventive gasket 211, and cover plate 207, which also includes an EMI gasket (not shown). Base plate 209 is supported on frame cross-member 103 by a selected number of passive isolation mounts 201. One or more spacers 202 may be provided between frame cross-member 103 and passive isolation mount 201. Spacer 202 provides clearance between frame cross-member 103 and base plate 209 resulting from compressive forces, such as impact forces to prevent such forces from reaching the RF oscillator circuitry 203 which define master source circuitry 109. Spacers 202 define a compression stroke distance, allowing the master source circuit 109 to move due to vibration or shock, without impacting the planar surface of the frame cross-member 103. Passive isolation mount 201 and spacer 202 may be formed from an elastomeric material.

Figure 3:
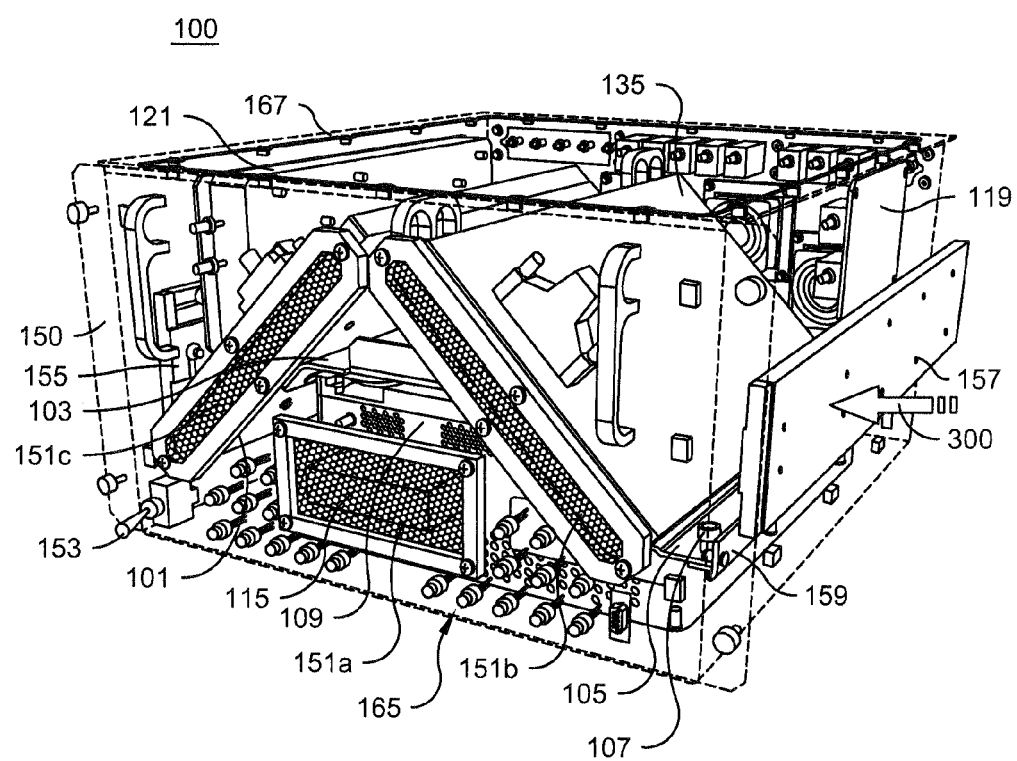
FIG. 3 is an isometric view of the RF frequency synthesizer of FIG. 1.

Referring now to FIG. 3 with reference to FIG. 1, RF frequency synthesizer 100 of FIG. 1 is shown as assembled with A-Frame assembly (101, 103) and RF oscillator circuitry housed on circuit boards 125, 135 and within master source circuitry 109, installed within chassis housing 150. Power supply assembly 115 is secured to the bottom surface of the chassis housing 150 along with processor assembly 111 (shown in FIG. 1) which are housed beneath the A-Frame assembly defined by folded sheet 101 and frame cross-member 103. Chassis housing 150 is installed into an equipment cabinet via a shim 155 and a retractable slide 157. Electro-mechanical disturbances (shown as arrow 300) in FIG. 3 may be transmitted via the cabinet and retractable slide 157 to the chassis housing 150. The vibrations are further transferred through the wall of the chassis housing 150 to the A-Frame assembly 101, 103 via mounting bracket 159, flange 105 and fasteners 107. While FIG. 3 shows electro-mechanical disturbance 300 approaching chassis 150 from its lateral side, this is provided by way of example only. Electro-mechanical disturbance 300 may be directed along any axis relative to the chassis housing 150 and A-frame assembly 101, 103.

Chassis housing 150 may include one or more light emitting diodes 165 installed on the face of chassis housing 150 which may provide statuses and/or states of various components or represent functionalities in the RF frequency synthesizer 100. Power to the RF frequency synthesizer 100 may be controlled by toggle switch 153 installed on the face of chassis housing 150. The chassis housing 150 may be enclosed from above by cover 167. Ventilation to the circuit boards inside chassis housing 150 may be provided by air inlets 151a, 151b and 151c which are defined in the face of chassis housing 150. Air inlets 151a, 151b, and 151c may be covered by an EMI shield which prevents EMI interference from entering the chassis housing 150 through the air inlets. Chassis housing 150 may house other system circuitry such as clock distribution circuit 119 and 10 MHz assembly 121, separate from the A-frame assembly as these components are less susceptible to kinematic disturbances.

Vibrational forces are represented generally by vector 300 in FIG. 3, by way of example. Disturbance vector 300 may approach the RF circuitry or RF components housed in chassis frame 150 along any axis. The disturbance vector 300 may be split into component vectors as a function of the angled shape of the A-Frame assembly. The component vectors have a fraction of the magnitude of original disturbance vector 300. The A-Frame assembly alters the spectral response of the external vibrations before they can reach the vibration sensitive equipment being supported by the A-Frame assembly. The component vectors may be controlled by tuning the A-frame assembly to alter the spectral response. Tuning is achieved by controlling the transmissibility (e.g. both amplitude and phase) of the incoming disturbance. Depending on the particular application and operating environment, the A-Frame assembly may be tuned to satisfy particular platform-specific phase noise and spurious requirements.

The A-Frame assembly may be tuned in at least the following ways provided herein by way of example. Folded sheet 101 may be fabricated at a selected thickness from specifically selected materials. For example, the sheet 101 and frame cross-member 103 may be made of a sufficiently rigid material such as a polymeric material, aluminum or other metal, as well as other suitable materials. The thickness of folded sheet 101 may also be varied. In addition, the angle between the first and second planar regions of the folded sheet 101 may be varied, which alters the way in which incoming vibration vectors 300 are split when reaching the A-Frame assembly. Still further, other characteristics of the A-frame assembly may be controlled to further tune the spectral response of the A-Frame assembly including but not limited to: the front to back depth of the folded sheet 101, the number and position of fasteners 107 connecting the A-frame assembly to mounting brackets 159, and/or the angle defined between the planar members of folded sheet 101 and the relative position of the folded sheet 101 with respect to the cross frame member 103. The variations described above affect the transmissibility characteristics of the A-Frame assembly and allow for selection of varied characteristics that accomplish desired goals of attenuating external vibration forces.

Referring again to FIG. 2, with respect to the master source circuitry (109, shown in detail in FIG. 2), base plate 209 may be selected with regard to thickness, dimensions and material to provide selected characteristics of vibrations transmissibility. Additionally, the number and relative positioning of passive isolation mounts 201 with respect to base plate 209 may also be controlled or selected to provide desired transmissibility characteristics and prevent unwanted interference from reaching the sensitive RF oscillators in the master source circuitry 109.

The spectral response (e.g. transmissibility) of the passive isolation assembly (illustrated in FIG. 6) may be tuned to set the natural frequency of the A-Frame support assembly. The passive isolation system may be tuned by altering the spectral signature of kinematic disturbances that affect vibration sensitive master source circuitry and components 109. Parameters that allow the passive isolation system response to be tuned include payload weight and payload center of gravity as well as design of the vibrational mount itself. These factors affect the correlation between the payload center of gravity and elastic center of the passive isolation system, which ultimately affect the spectral signature of kinematic disturbances that in turn affect the vibration sensitive master source circuitry and components 109. In one embodiment, the natural frequency is selected to be in a range of about 30 Hz to about 40 Hz. For example, the A-Frame assembly may be tuned to have a natural frequency of about 40 Hz, by way of non-limiting example. Other natural frequencies may be selected based on the application. For example, in other embodiments, the A-Frame support assembly may be tunable for natural frequencies of 30 Hz, 50 Hz or 100 Hz, by way of non-limiting example.

Figure 4:
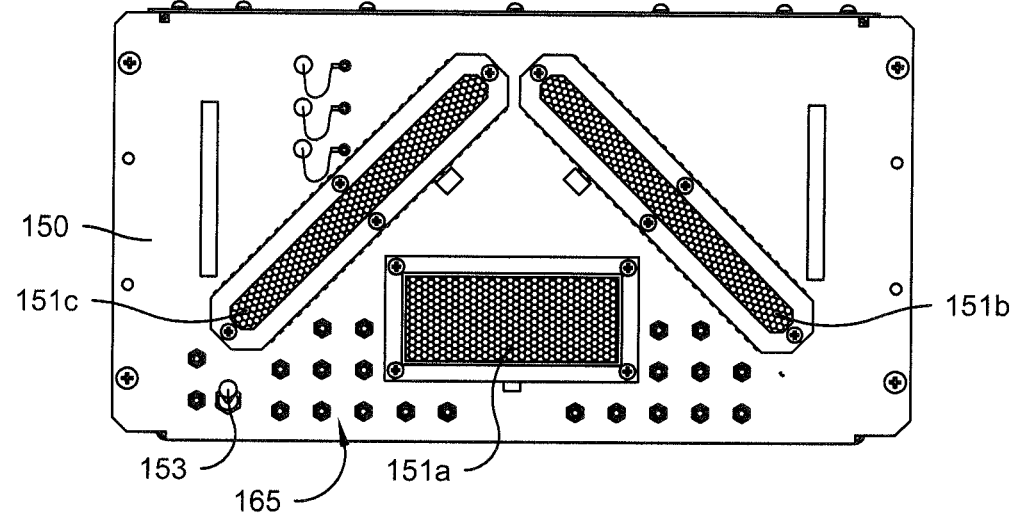
FIG. 4 is an elevation view of an RF frequency synthesizer according to an embodiment of the disclosure.

FIG. 4 is an elevation view of the front facing surface of chassis housing 150. The facing surface houses toggle switch 153 for controlling power to the RF frequency synthesizer, an arrangement of light emitting diodes 165 to provide status indications for components of the RF frequency synthesizer and air inlets 151a, 151b, and 151c, which are aligned with respect to the RF circuitry and RF components supported by the A-Frame assembly.

Figure 5:
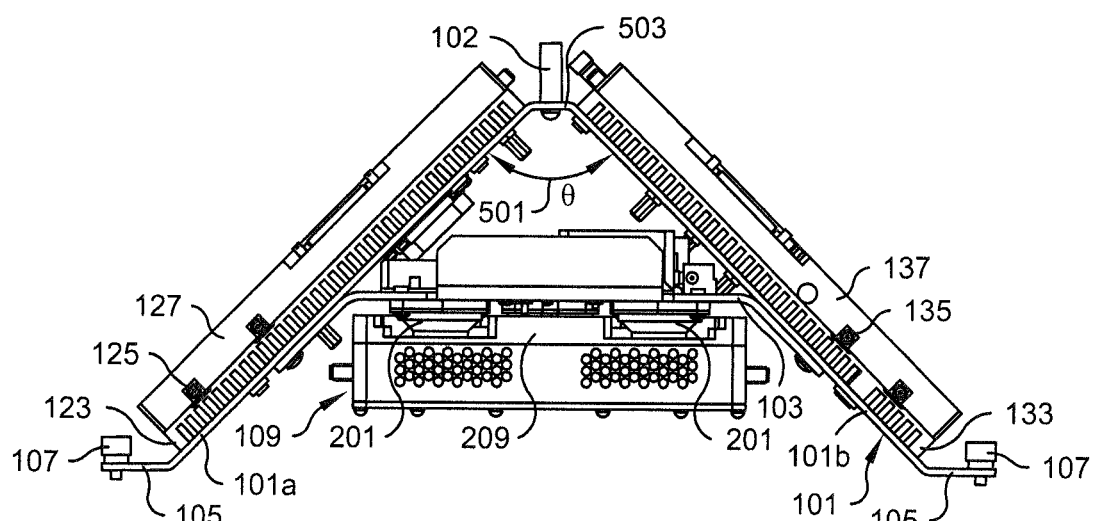
FIG. 5 is an elevation view of an A-Frame assembly for supporting vibration sensitive RF circuitry and RF components according to an embodiment of the disclosure.

FIG. 5 provides an elevation view of the A-Frame Assembly which includes folded sheet 101. When folded at angle θ 501, folded sheet 101 defines a first planar region 101a and a second planar region 101b. First planar region 101a may have a surface area that is equal to the surface are of second planar region 101b. The first planar region 101a and second planar region 101b may be configured such that they are symmetrical relative to the plane which bisects angle θ 501. Frame cross-member 103 extends between first planar region 101a and second planar region 101b across angle 501. Frame cross-member 103 supports master source circuitry 109. Master source circuitry 109 is connected to frame cross-member 103 via base plate 209 and passive isolation mounts 201 along with spacers 202 (shown in FIG. 2). The A-Frame assembly attaches to the chassis housing 150 (shown in FIG. 3) via flange 105 and fasteners 107. The mounting position of the frame cross-member 103 relative to the peak of folded sheet 101 will alter the spectral response of the A-Frame assembly and may be selected as one means of tuning the spectral response of the A-Frame assembly. First planar region 101a supports an RF oscillator or RF components on a circuit board 125 through heat sink 123. Circuit board 125 supporting vibration sensitive RF components is protected from EMI by EMI shield 127 which covers the RF circuit components of circuit board 125. Second planar region 101b, supports circuit board 135 through heat sink 133. Circuit board 135 supporting vibration sensitive RF components is protected from EMI by EMI shield 137 which covers the RF circuit components supported by circuit board 135. Folded sheet 101 may be folded to define a bevel 503 between first planar region 101a and second planar regions 101b. Bevel 503 may be configured to receive one or more handles 102 for allowing easy removal of the A-frame assembly from the chassis housing.

Figure 6:
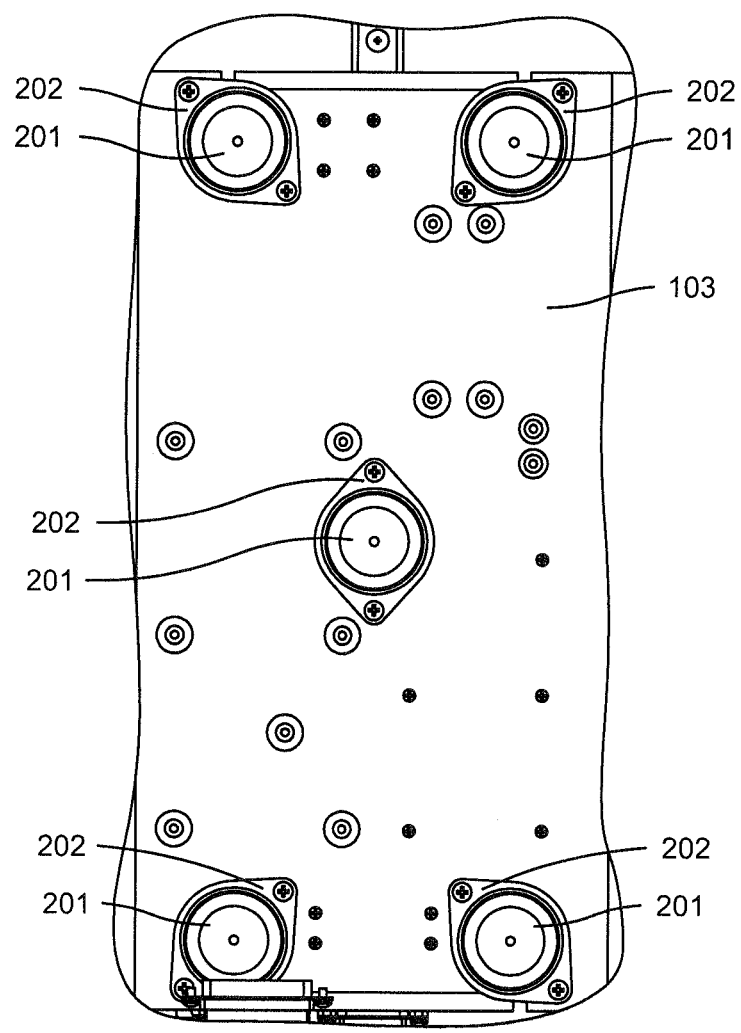
FIG. 6 is a plan view of a base plate and passive isolation mounts for supporting vibration sensitive RF circuitry and RF components in the A-Frame assembly of FIG. 5 according to an embodiment of the disclosure.

FIG. 6 provides a plan view of a passive isolation mount assembly according to an embodiment of this disclosure. A base plate is mounted to the opposite surface of cross-member 103. Passive isolation mounts 201 and accompanying spacers 202 secure the base plate to the cross-member 103. Passive isolation mounts 201 and spacers 202 provide passive mechanical isolation of RF oscillators, RF components, and/or RF circuitry mounted on the base plate from external sources of kinematic disturbances. As described above, the kinematic disturbance spectral response may be tuned by varying the thickness, dimensions, mounting position, configuration depth or choice of material comprising the base plate. In addition, desired isolation characteristics may be achieved by selecting the number and positioning of passive isolation mounts 201, altering the spectral signature of kinematic disturbances that affect vibration and sensitive master source circuitry and components 109 mounted on the base plate. Parameters that allow the passive isolation system response to be tuned include payload weight and payload center of gravity as well as design of the vibrational mount itself. These factors affect the correlation between the payload center of gravity and elastic center of the passive isolation system, which ultimately affect the spectral signature of kinematic disturbances that in turn affect the vibration sensitive master source circuitry and components 109. In the embodiment shown in FIG. 6, five passive isolation mounts 201 are used and are arranged approximately at the four corners of the base plate with an additional passive isolation mount positioned at the approximate center of the base plate. The number and arrangement of passive isolation mounts 201 may be selected to provide specifically selected spectral response, (e.g. transmissibility, natural frequency, damping and roll off). The A-frame metal architecture spatially separates the kinematic inputs from the vibration sensitive RF circuitry and RF components. This separation splits incoming disturbance vectors over two or more axes and reduces the magnitude of the disturbance vector in the process. The integrated A-frame assembly is thus designed for manufacturability, testability, and maintainability.

While the foregoing invention has been described with reference to the above-described embodiment, various modifications and changes can be made without departing from the spirit of the invention. Accordingly, all such modifications and changes are considered to be within the scope of the appended claims. Accordingly, the specification and the drawings are to be regarded in an illustrative rather than a restrictive sense. The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations of variations of various embodiments. Combinations of the above embodiments, and other embodiments not specifically described herein, will be apparent to those of skill in the art upon reviewing the above description.

What is claimed is:

1. A radio frequency (RF) synthesizer comprising: a chassis housing configured to hold components of the RF synthesizer, the chassis housing being installable into an instrument cabinet; at least one mounting bracket connected to at least one interior side of the chassis housing; an A-frame assembly configured to support at least one component of the RF synthesizer, the at least one component being susceptible to vibrational noise, the A-frame assembly being attached to the at least one mounting bracket, wherein the A-frame assembly comprises: at least two planar regions wherein at least one of the at least two planar regions support the at least one component of the RF synthesizer that is sensitive to vibrational noise, wherein the at least two planar regions include a first planar region and a second planar region which contact each other at a common edge to form an angle between the first planar region and the second planar region, and a third planar region defining a frame cross-member attached to the first planar region and the second planar region, the frame cross-member spanning the angle between the first planar region and the second planar region.

2. The RF synthesizer of claim 1, further comprising at least one heat sink disposed between the at least one planar region and the at least one component of the RF synthesizer, the at least one heat sink being in thermal contact with at least one of the first planar region and the second planar region.

3. The RF synthesizer of claim 1, wherein the first planar region and the second planar region are defined by a folded sheet of material.

4. The RF synthesizer of claim 3, further comprising: a bezel defined at the fold in the folded sheet of material; and at least one handle attached to the bezel.

5. The RF synthesizer of claim 1, further comprising: at least one electromagnetic interference (EMI) shield surrounding the at least one component of the RF synthesizer that is susceptible to vibrational noise.

6. The RF synthesizer of claim 1, further comprising at least one of: a power supply, a processor board assembly, a 10 MHz circuit assembly, a clock distribution circuit and an alternating current (AC) power filter, installed in the chassis housing and spatially separated from the A-frame assembly.

7. The RF synthesizer of claim 1, further comprising a passive isolation mount assembly comprising: a base plate configured to support the at least one component of the RF synthesizer susceptible to vibrational noise; and at least one passive isolation mount member between the base plate and one of the at least two planar regions supporting the at least one component of the RF synthesizer susceptible to vibrational noise.

8. The RF synthesizer of claim 7, wherein the passive isolation mount assembly further comprises: at least one spacer corresponding to each of the at least one passive isolation mount member disposed between the corresponding at least one passive isolation mount member and the base plate.

9. The RF synthesizer of claim 7, wherein the at least one passive isolation mount member comprises an elastomeric material.

10. The RF synthesizer of claim 1, further comprising a passive isolation mount assembly comprising: a base plate configured to support the at least one component of the RF synthesizer susceptible to vibrational noise on the frame cross-member; and at least one passive isolation mount member between the base plate and the third planar region.

11. The RF synthesizer of claim 1, wherein each of the at least two planar regions includes a first surface and a second surface opposite the first surface and the at least one component of the RF synthesizer that is susceptible to vibrational noise is supported on one of the first surface and the second surface.

12. An A-frame assembly for supporting vibration sensitive radio frequency (RF) components comprising: a first planar region; a second planar region, wherein at least one of the first planar region and the second planar region are configured to support at least one of the vibration sensitive RF components, and wherein the first planar region and the second planar region are in contact with one another along a common edge, the common edge defining an angle between the first planar region and the second planar region, and a planar frame cross-member attached to the first planar region and the second planar region, the planar frame cross-member spanning the angle between the first planar region and the second planar region.

13. The A-frame support assembly of claim 12, wherein the planar frame cross member includes a first planar surface and a second planar surface opposite the first planar surface, wherein one of the first planar surface and the second planar surface supports at least one vibration sensitive RF component.

14. The A-frame support assembly of claim 12, further comprising: a pair of flanges on opposing ends of the first planar region and the second planar region, the pair of flanges configured to receive at least one fastener for attaching the A-frame support assembly to a pair of mounting brackets of a chassis housing.

15. A method for tuning the spectral response of an assembly configured to support vibration sensitive radio frequency (RF) components, the assembly including a first planar region and a second planar region arranged with respect to one another to define an angle along a common edge of the first planar region and the second planar region, and a third planar region defining a frame cross member attached to the first planar region and the second planar region, the frame cross member spanning the angle defined between the first planar region and the second planar region, the method comprising the steps of: selecting a material for at least one of the first planar region, the second planar region and the third planar region, wherein the spectral response of the assembly is dependent at least in part on the selected material; and selecting a thickness of at least one of the first planar region, the second planar region and the third planar region, wherein the spectral response of the assembly is dependent at least in part on the selected thickness.

16. The method of claim 15, further comprising the step of: selecting a distance between the vertex of the angle defined between the first planar region and the second planar region and a surface of the third planar region of the frame cross member, wherein the spectral response of the assembly is dependent at least in part on the selected distance.

17. The method of claim 15, further comprising the step of: selecting the angle defined between the first planar region and the second planar region, wherein the spectral response of the assembly is dependent at least in part on the selected angle between the first planar region and the second planar region.

18. The method of claim 15, further comprising the step of: selecting the number and position of at least one fastener configured to secure the assembly to a mounting bracket in a chassis housing, wherein the spectral response of the assembly is dependent at least in part on the number and position of the at least one fastener.

* * * * *